(12) United States Patent
Shin et al.

(10) Patent No.: US 10,700,714 B2
(45) Date of Patent: Jun. 30, 2020

(54) METHOD OF OPERATING DECODER FOR REDUCING COMPUTATIONAL COMPLEXITY AND METHOD OF OPERATING DATA STORAGE DEVICE INCLUDING THE DECODER

(71) Applicant: SAMSUNG ELECTRONICS CO., LTD., Suwon-si, Gyeonggi-do (KR)

(72) Inventors: Dong Min Shin, Seoul (KR); Beom Kyu Shin, Seongnam-si (KR); Heon Hwa Cheong, Yongin-si (KR); Jun Jin Kong, Yongin-si (KR); Hong Rak Son, Anyang-si (KR); Yeong Geol Song, Seoul (KR); Se Jin Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/229,153

(22) Filed: Dec. 21, 2018

(65) Prior Publication Data
US 2019/0132010 A1 May 2, 2019

Related U.S. Application Data

(63) Continuation of application No. 15/613,659, filed on Jun. 5, 2017, now Pat. No. 10,164,663.

(30) Foreign Application Priority Data

Jun. 14, 2016 (KR) .................. 10-2016-0073538

(51) Int. Cl.
*H03M 7/40* (2006.01)
*H03M 13/39* (2006.01)
*H03M 13/11* (2006.01)

(52) U.S. Cl.
CPC .... *H03M 13/3927* (2013.01); *H03M 13/1117* (2013.01)

(58) Field of Classification Search
CPC .......... H03M 13/1102; H03M 13/1114; H03M 13/1131; H03M 13/1137; H03M 13/1148;
(Continued)

(56) References Cited

U.S. PATENT DOCUMENTS 8,095,863 B2  1/2012  Xin
8,407,556 B2  3/2013  Shen et al.
(Continued)

OTHER PUBLICATIONS

Achilleas Anastasopoulos, "A comparison between the sum-product and the min-sum iterative detection algorithms based on density evolution," Global Telecommunications Conference, 2001. GLOBECOM '01. IEEE,Year: 2001, vol. 2, pp. 1021-1025.
(Continued)

*Primary Examiner* — Linh V Nguyen
(74) *Attorney, Agent, or Firm* — Volentine, Whitt & Francos, PLLC

(57) ABSTRACT

A method of operating a decoder, which has variable nodes and check nodes, includes receiving variable-to-check (V2C) messages from the variable nodes using a first check node among the check nodes. The number of messages having a specific magnitude among the V2C messages is counted. The magnitude of a check-to-variable (C2V) message to be transmitted to a first variable node, among the variable nodes, is determined based on the count value and the magnitude of a V2C message of the first variable node.

19 Claims, 12 Drawing Sheets

(58) Field of Classification Search
CPC .......... H03M 13/116; H03M 13/1168; H03M 13/1177; H03M 13/1197; H03M 13/2939; H03M 13/2972; H03M 13/6356; H03M 13/6362; H03M 13/6505; H03M 13/6566; H03M 13/05; H03M 13/09; H03M 13/1117; H03M 13/112; H03M 13/1128; H03M 13/1134; H03M 13/1191; H03M 13/1515
USPC ...................................................... 341/74–96
See application file for complete search history.

(56) References Cited

U.S. PATENT DOCUMENTS

| | | | |
|---|---|---|---|
| 8,458,556 B2 | 6/2013 | Planjery et al. | |
| 8,914,710 B2 | 12/2014 | Ish-Shalom et al. | |
| 8,984,378 B1 | 3/2015 | Chilappagari et al. | |
| 9,003,267 B2 | 4/2015 | Varnica et al. | |
| 9,450,606 B1 | 9/2016 | Winter | |
| 10,164,663 B2* | 12/2018 | Shin | H03M 13/3927 |
| 2003/0033575 A1* | 2/2003 | Richardson | G06N 3/02 714/799 |
| 2006/0026486 A1* | 2/2006 | Richardson | H03M 13/1105 714/758 |
| 2008/0320374 A1 | 12/2008 | Prabhakar et al. | |
| 2009/0063931 A1* | 3/2009 | Rovini | H03M 13/1137 714/758 |
| 2009/0313525 A1* | 12/2009 | Savin | H03M 13/1131 714/752 |
| 2010/0281337 A1* | 11/2010 | Lo | H03M 13/11 714/758 |
| 2011/0126078 A1 | 5/2011 | Ueng et al. | |
| 2011/0161770 A1* | 6/2011 | Ueng | H03M 13/1137 714/752 |
| 2011/0246850 A1* | 10/2011 | Rault | H03M 13/1128 714/752 |
| 2012/0036410 A1* | 2/2012 | Rault | H03M 13/1128 714/752 |
| 2012/0110408 A1* | 5/2012 | Xin | H03M 13/1105 714/752 |
| 2013/0097475 A1* | 4/2013 | Wang | H03M 13/1108 714/784 |
| 2013/0101074 A1 | 4/2013 | Hickling | |
| 2013/0173985 A1 | 7/2013 | Chung et al. | |
| 2014/0281786 A1* | 9/2014 | Ueng | H03M 13/114 714/752 |
| 2015/0286523 A1 | 10/2015 | Cai et al. | |
| 2015/0326249 A1 | 11/2015 | Zhang | |
| 2015/0363247 A1* | 12/2015 | Bisplinghoff | G06F 11/076 714/704 |
| 2015/0381204 A1 | 12/2015 | Zhang et al. | |

OTHER PUBLICATIONS

Vikram Arkalgud Chandrasetty et al., "An area efficient LDPC decoder using a reduced complexity min-sum algorithm," Integration, the VLSI Journal 45 (2012), pp. 141-148.

Frank R. Kschischang et al., "Factor Graphs and the Sum-Product Algorithm," IEEE Transactions on Information Theory, vol. 47, No. 2, Feb. 2001, pp. 498-519.

Vikram Arkalgud Chandrasetty et al., "FPGA Implementation of High Performance LDPC Decoder using Modified 2-bit Min-Sum Algorithm," 2010 Second International Conference on Computer Research and Development Year: 2010, pp. 881-885.

Mohammad M. Mansour et al., "High-Throughput LDPC Decoders," IEEE Transactions on Very Large Scale Integration Systems, vol. 11, No. 6, Dec. 2003, pp. 976-996.

Z. Cui et al., "Reduced-complexity column-layered decoding and implementation for LDPC codes," IET Commun., 2011, vol. 5, Issue 15, pp. 2177-2186.

Juntan Zhang et al., "Shuffled Iterative Decoding," IEEE Transactions on Communications, vol. 53, No. 2, Feb. 2005, pp. 209-213.

* cited by examiner

FIG. 2

TABLE1

| LLRV | SB | ABSOLUTE VALUE | RELIABILITY | FLAG/MB |
|---|---|---|---|---|
| −3 | 1 | 3 | S | 0 |
| −2 | 1 | 2 | S | 0 |
| −1 | 1 | 1 | W | 1 |
| 0 | 0 | 0 | W | 1 |
| 1 | 0 | 1 | W | 1 |
| 2 | 0 | 2 | S | 0 |
| 3 | 0 | 3 | S | 0 |

FIG. 5

TABLE2

| Input | | Output |
|---|---|---|
| W's count(K) | MAGNITUDE OF V2C MESSAGE | MAGNITUDE OF C2V MESSAGE |
| 2 | Don't Care | W |
| 0 | Don't Care | S |
| 1 | W | S |
| 1 | S | W |

FIG. 6

If (CNT > 1)  C2V magnitude = W;
Else if (CNT ==1 && V2C magnitude = W) C2V magnitude = S;
Else if (CNT ==1 && V2C magnitude = S) C2V magnitude = W;
Else                                  C2V magnitude = S

FIG. 7

If (new V2C CNT > 1 ) CNT = 2;
Else if (new V2C CNT == 1 ) CNT = 1;
Else                        CNT = 0

FIG. 8

If (new V2C magnitude = W && old C2V magnitude = S) CNT = CNT + 1;
Else if (new V2C magnitude = S && old C2V magnitude = W) CNT = CNT − 1;
Else                                                     CNT = CNT

FIG. 9

CASE I { If (CNT > MAX_CNT) CNT = MAX_CNT
         Else if ( CNT < 0 ) CNT = 0

CASE II { If (CNT > MAX_CNT) CNT = CNT − (MAX_CNT + 1)
          Else if (CNT < 0) CNT = CNT + (MAX_CNT + 1)

FIG. 12

TABLE3

| Input | | | | Output |
|---|---|---|---|---|
| 0's count | 1's count | 2's count | MAGNITUDE OF V2C MESSAGE | MAGNITUDE OF C2V MESSAGE |
| >=2 | - | - | - | 0 |
| 1 | 0 | 0 | 0 | 3 |
| 1 | 0 | >=1 | 0 | 2 |
| 1 | >=1 | - | 0 | 1 |
| 1 | - | - | >=1 | 0 |
| 0 | >=2 | - | - | 1 |
| 0 | 1 | 0 | 1 | 3 |
| 0 | 1 | >=1 | 1 | 2 |
| 0 | 1 | - | >=2 | 1 |
| 0 | 0 | >=2 | - | 2 |
| 0 | 0 | 1 | 2 | 3 |
| 0 | 0 | 1 | 3 | 2 |
| 0 | 0 | 0 | - | 3 |

'-' : Don't Care

METHOD OF OPERATING DECODER FOR REDUCING COMPUTATIONAL COMPLEXITY AND METHOD OF OPERATING DATA STORAGE DEVICE INCLUDING THE DECODER

CROSS-REFERENCE TO RELATED APPLICATION

This is a Continuation of U.S. application Ser. No. 15/613,659, filed Jun. 5, 2017, which claims priority under 35 U.S.C. § 119(a) from Korean Patent Application No. 10-2016-0073538 filed on Jun. 14, 2016, the disclosure of which is hereby incorporated by reference in its entirety.

BACKGROUND

Embodiments of the disclosure relate to a decoding method, and more particularly, to a method of operating a decoder for counting the number of messages having a specific reliability and storing a count value to maintain error correction performance and reduce computational complexity and a method of operating a data storage device including the decoder.

In flash memory systems which use a low density parity check (LDPC) code as an error correction code, an LDPC decoder converts input data into a log-likelihood ratio (LLR) value and transmits the LLR value to a variable node. The LDPC decoder converts an LLR value of at least one variable node into a variable-to-check (V2C) message and transmits the V2C message to a check node. The check node generates a check-to-variable (C2V) message using the at least one V2C message and transmits the C2V message to a variable node.

The check node uses a min-sum algorithm to determine the magnitude of the C2V message. The min-sum algorithm uses "min1", "min2", and "min1_index" to calculate the magnitude of the C2V message. Here, "min1" denotes the most minimum value among V2C messages, "min2" denotes the second most minimum value among the V2C messages, and "min1_index" denotes an index of a variable node corresponding to "min1". Each of the minimum values min1 and min2 has the same number of bits as the absolute value of a message and the index min1_index is determined only by an H-matrix (code design) of the LDPC decoder regardless of the precision of the message.

SUMMARY

According to some embodiments of the disclosure, there is provided a method of operating a decoder that includes variable nodes and check nodes. The method includes receiving variable-to-check (V2C) messages from the variable nodes using a first check node among the check nodes, counting the number of messages having a specific magnitude among the V2C messages, generating a count value of the number of messages, and determining the magnitude of a check-to-variable (C2V) message to be transmitted to a first variable node among the variable nodes based on the count value and the magnitude of a V2C message of the first variable node.

According to other embodiments of the disclosure, there is provided a method of operating a data storage device which includes a memory device and a controller having a decoder which includes variable nodes and check nodes. The method includes receiving N-bit data from the memory device, where N is a real number of at least 1; mapping each of the bits in the N-bit data to a log-likelihood ratio (LLR) value; interpreting the LLR value using each of the variable nodes and generating a V2C message; receiving a V2C message from at least some of the variable nodes using a first check node among the check nodes; counting the number of messages having a specific magnitude among V2C messages and generating a count value; and determining the magnitude of a C2V message to be transmitted to a first variable node among the variable nodes based on the count value and the magnitude of a V2C message of the first variable node.

According to other embodiments of the disclosure, there is provided a memory card having a nonvolatile memory that stores N-bit data and a memory controller. The memory controller: receives the N-bit data from the nonvolatile memory; maps each of the bits in the N-bit data to a log-likelihood ratio (LLR) value; receives an LLR value of each of variable nodes and generates a variable-to-check (V2C) message corresponding to each LLR value; generates a count of the number of messages having a specific magnitude among the V2C messages; and determines the magnitude of a check-to-variable (C2V) message to be transmitted to a first variable node among the variable nodes based on the count value and the magnitude of a V2C message of the first variable node.

BRIEF DESCRIPTION OF THE DRAWINGS

The above and other features and advantages of the disclosure will become more apparent by describing in detail exemplary embodiments thereof with reference to the attached drawings in which:

FIG. 2 is a table for explaining a method of determining the magnitude of a variable-to-check (V2C) message using a variable node module illustrated in FIG. 1;

FIG. 5 is a table for explaining the method of determining the magnitude of a C2V message using the check node module illustrated in FIG. 1 according to some embodiments of the disclosure;

FIG. 6 shows an algorithm used to determine the magnitude of a C2V message in the check node module illustrated in FIG. 1;

FIG. 7 shows an algorithm used to determine a count value to be stored in a check node in a layered decoder architecture;

FIG. 8 shows an algorithm used to determine a count value to be updated in a check node in a shuffled decoder architecture;

FIG. 9 shows an algorithm used to approximately determine a count value to be updated in a check node in the shuffled decoder architecture;

FIG. 12 is a table for explaining the method of determining the magnitude of a C2V message using the check node module illustrated in FIG. 1 according to other embodiments of the disclosure;

DETAILED DESCRIPTION OF THE EMBODIMENTS

Figure 1:
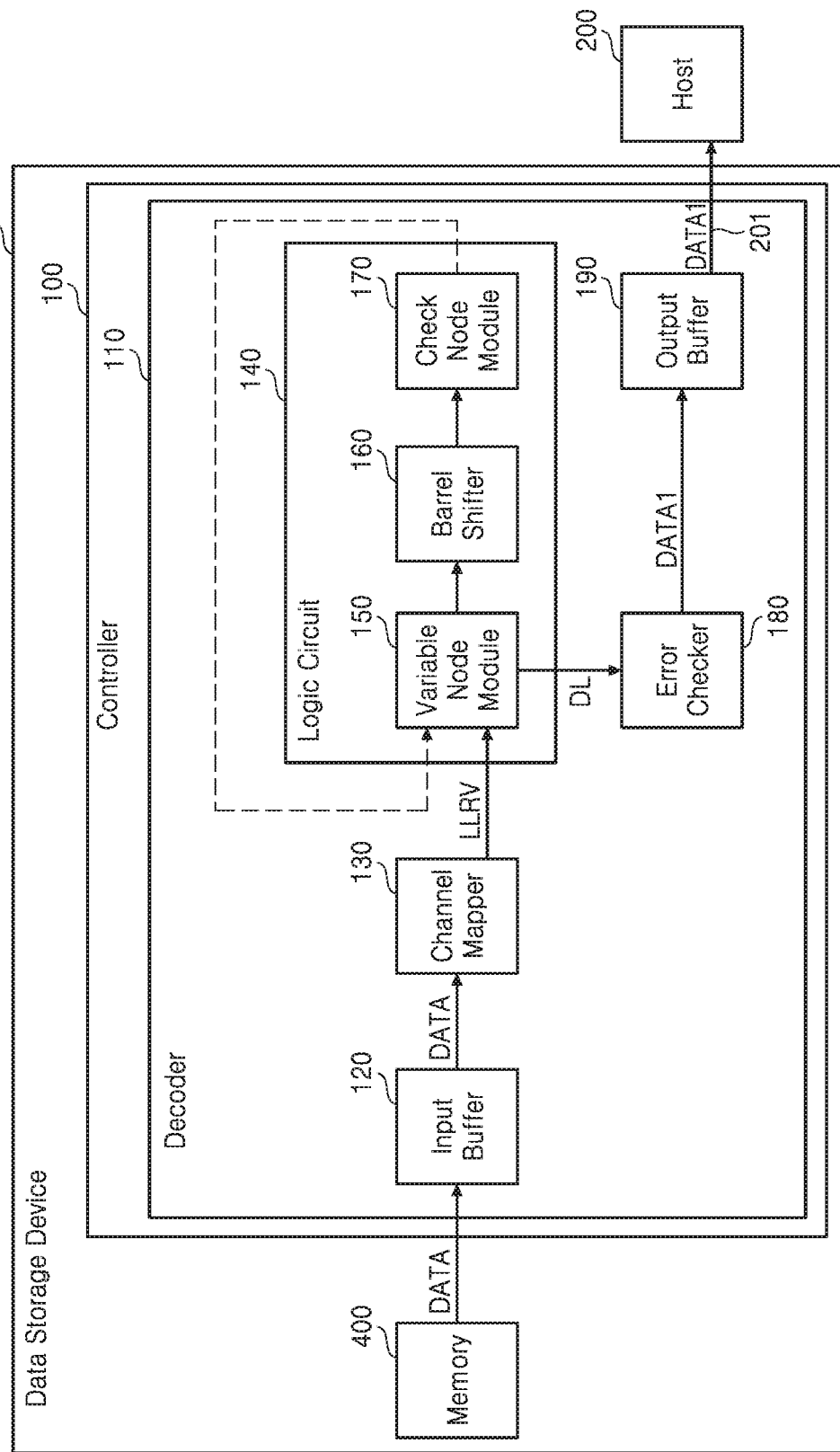
FIG. 1 is a block diagram of a data processing system according to some embodiments of the disclosure.

FIG. 1 is a block diagram of a data processing system according to some embodiments of the disclosure. The data processing system 500 may include a host 200 and a data storage device (or a storage medium) 300. The host 200 and the data storage device 300 may communicate commands or data with each other through an interface 201.

The data processing system 500 may be implemented as a personal computer (PC), a data server, or a portable electronic device. The portable electronic device may be a laptop computer, a cellular phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, or an e-book.

The host 200 may control the operation of the data storage device 300. The data storage device 300 may include a memory 400 and a controller 100. The data storage device 300 may be an embedded multimedia card (eMMC), a universal flash storage (UFS), a solid state drive (SSD), or a redundant array of independent disks or redundant array of inexpensive disks (RAID) but is not restricted to these examples.

The memory 400 may be a non-volatile memory-based data storage device such as flash memory. Non-volatile memory may include electrically erasable programmable read-only memory (EEPROM), magnetic random access memory (MRAM), ferroelectric RAM (FeRAM), phase-change RAM (PRAM), or resistive RAM (RRAM). The memory 400 may include a plurality of NAND flash memory devices. At least one of the NAND flash memory devices may include a three-dimensional (3D) memory cell array.

The 3D memory cell array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The controller 100 may communicate commands or data with the host 200 through the interface 201 and may communicate commands or data with the memory 400. The controller 100 may control the overall operation (including a write operation, a read operation, an erase operation, encoding, decoding, and error correction) of the memory 400. The controller 100 may exchange data with the memory 400 through a transmission medium (such as a transmission line or a bus).

The controller 100 may include a decoder 110, which may be implemented as a low density parity check (LDPC) decoder. The decoder 110 may perform LDPC decoding on data output from the memory 400. The decoder 110 may include an input buffer 120, a channel mapper 130, a logic circuit (or a logic circuitry) 140, an error checker 180, and an output buffer 190. The input buffer 120 may receive N-bit data from the memory 400, where N is a natural number of at least 2.

The channel mapper 130 may map each bit in the data output from the input buffer 120 to a log-likelihood ratio (LLR) value LLRV. The LLR value LLRV may be expressed as an integer or a real number and may include information indicating whether a logic value of a bit is logic 0 or logic 1 and information indicating how reliable the value of the bit is.

The logic circuit 140 may include a variable node module 150, a barrel shifter 160, and a check node module 170. The variable node module 150 may include a plurality of variable nodes. The check node module 170 may include a plurality of check nodes. The barrel shifter 160 may interleave messages transferred between the variable nodes and the check nodes. Here, the messages include variable-to-check (V2C) messages and check-to-variable (C2V) messages. The structure and operations of the variable node module 150 and the check node module 170 will be described with reference to FIGS. 4 and 5 later.

The logic circuit 140 may receive LLR values LLRV from the channel mapper 130, may generate V2C messages corresponding to the LLR values LLRV, may perform C2V magnitude computation, which will be described below, on the V2C messages, may generate C2V messages according to the result of the computation, and may output decoded LLR values DL corresponding to the C2V messages.

The check node module 170 includes a plurality of check nodes. A current check node among the plurality of check nodes may receive V2C messages from variable nodes related with the current check node, may generate a count value by counting the number of V2C messages having a specific magnitude or reliability among the V2C messages, and may determine the magnitude of a C2V message to be transmitted to a variable node to be processed among the variable nodes based on the count value and the magnitude of a V2C message of the variable node to be processed. The C2V message having the determined magnitude may be transmitted to the variable node module 150. The C2V message may include a sign bit indicating a sign of the C2V message and a magnitude bit indicating the magnitude of the C2V message. A procedure for determining the sign of the C2V message will be described with reference to FIG. 4 later.

A message may include a sign bit indicating the sign of the message and a magnitude bit indicating the magnitude of the message. The sign bit may be one bit in length and the magnitude bit may be one or more bits in length. In a decoder using 2-bit precision, the sign bit is one bit and the magnitude bit is one bit. In a decoder using T-bit precision, the sign bit is one bit and the magnitude bit is (T-1) bits, where T is a natural number of at least 3.

In the embodiments of the disclosure, count value-magnitude computation may refer to an operation in which the number of V2C messages having a specific magnitude or reliability is counted using a counter and the magnitude of a C2V message is determined using the count value, and by which the computational complexity of the decoder 110 is minimized. The specific magnitude or the specific reliability will be described in detail with reference to FIGS. 2 and 12 later.

A method of operating a decoder using 2-bit precision will be described with reference to FIGS. 2 through 10. A method of operating a decoder using 3-bit precision will be described with reference to FIGS. 11 and 12. A method of operating a decoder using at least 4-bit precision will be understood with reference to the method of operating the decoder using 2-bit or 3-bit precision.

An iteration between a variable node and a check node refers to a procedure for the variable node receiving a C2V message from the check node after a V2C message is transmitted from the variable node to the check node. As the number of iterations increases, the reliability of an LLR value increases, and therefore, a decoding success probability increases.

The error checker 180 may check on errors using the sign bits of the decoded LLR values DL output from the variable node module 150. The error checker 180 may transmit data DATA1 to the output buffer 190 according to the check result. The output buffer 190 may transmit the data DATA1 to the host 200 through the interface 201. When there is no error in the decoded LLR values DL, the error checker 180 may generate control signals for disabling the variable node module 150 and the check node module 170. When the variable node module 150 and the check node module 170 are disabled, the error checker 180 may transmit the data DATA1 to the output buffer 190.

Figure 3:
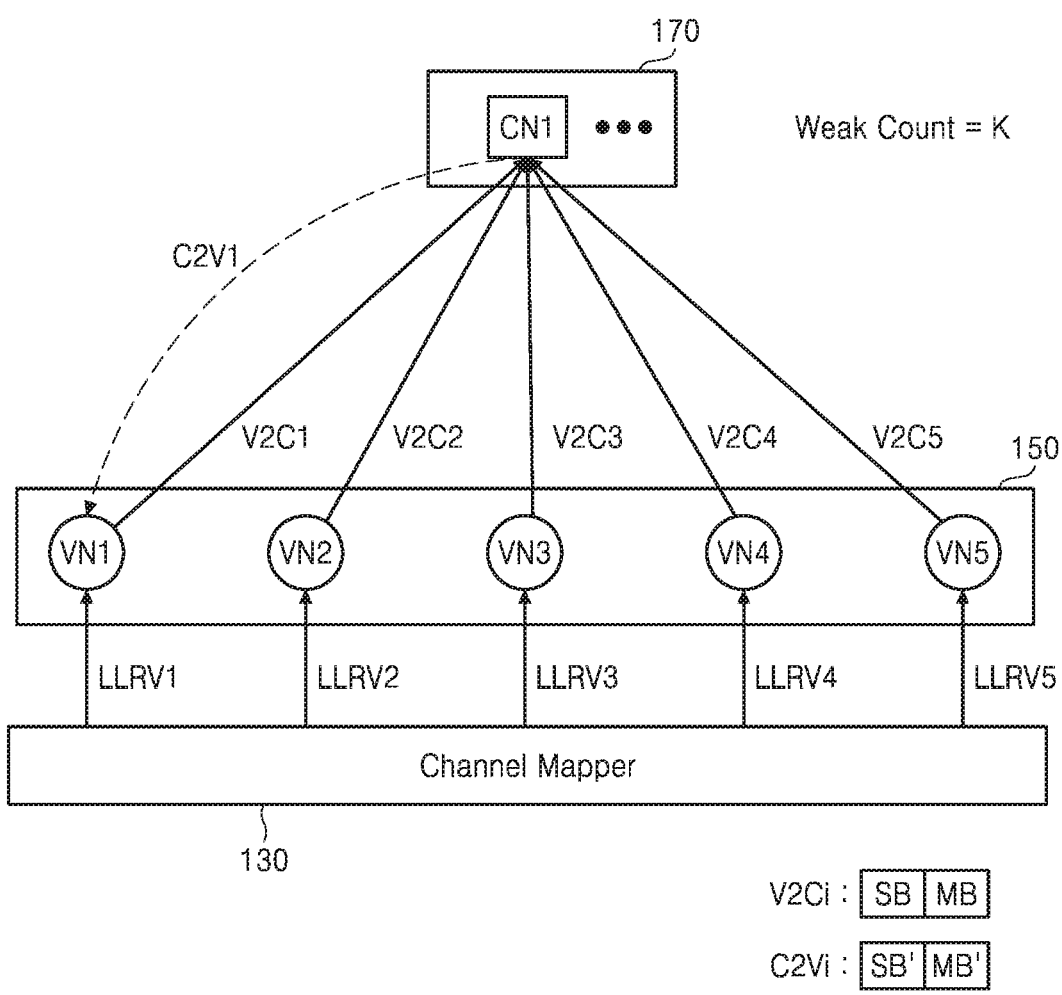
FIG. 3 is a conceptual diagram for explaining the operation of a logic circuit illustrated in FIG. 1.

FIG. 2 is a table for explaining a method of determining the magnitude of a V2C message using the variable node module illustrated in FIG. 1. FIG. 3 is a conceptual diagram for explaining the operation of the logic circuit illustrated in FIG. 1. Referring to FIGS. 1 through 3, the variable node module 150 may receive the LLR values LLRV from the channel mapper 130 and may generate V2C messages corresponding to the LLR values LLRV. When the decoder 110 uses 2-bit precision, each message includes a 1-bit sign bit and a 1-bit magnitude bit. The magnitude bit may include a flag indicating a specific magnitude or a specific reliability.

As shown in FIG. 3, the variable node module 150 may include a plurality of variable nodes VN1 through VN5. Each of the variable nodes VN1 through VN5 may generate a V2C message V2C1, V2C2, V2C3, V2C4, or V2C5 using an LLR value LLRV expressed as an integer or a real number.

The specific magnitude or reliability may be divided into a weak reliability W and a strong reliability S according to how reliable is the value of bits representing the LLR value LLRV. For instance, as shown in the first table TABLE1, it is assumed that when the sign of the LLR value LLRV is negative, the logic value of a sign bit SB is defined as logic 1; when the sign of the LLR value LLRV is positive, the logic value of the sign bit SB is defined as logic 0.

Referring to the first table TABLE1, when the sign of the LLR value LLRV is negative and the absolute value of the LLR value LLRV increases from zero to three, the probability that a logic value corresponding to the LLR value LLRV is 1 increases. When the sign of the LLR value LLRV is positive and the absolute value of the LLR value LLRV increases from zero to three, the probability that a logic value corresponding to the LLR value LLRV is 0 increases. It is assumed that when the absolute value of the LLR value LLRV is equal to or less than 1, the LLR value LLRV has the weak reliability W; when the absolute value of the LLR value LLRV is equal to or greater than 2, the LLR value LLRV has the strong reliability S.

Referring to FIGS. 2 and 3, when an LLR value LLRV1 input to the first variable node VN1 is −3 or −2; the first variable node VN1 determines that the reliability of the LLR value LLRV1 is the strong reliability S, generates the first V2C message V2C1 (=10) including the sign bit SB (=1) and a magnitude bit MB (=0), and transmits the first V2C message V2C1 (=10) to a first check node CN1. When the LLR value LLRV1 input to the first variable node VN1 is −1; the first variable node VN1 determines that the reliability of the LLR value LLRV1 is the weak reliability W, generates the first V2C message V2C1 (=11) including the sign bit SB (=1) and the magnitude bit MB (=1), and transmits the first V2C message V2C1 (=11) to the first check node CN1.

When the LLR value LLRV1 input to the first variable node VN1 is 3 or 2; the first variable node VN1 determines that the reliability of the LLR value LLRV1 is the strong reliability S, generates the first V2C message V2C1 (=00) including the sign bit SB (=0) and the magnitude bit MB (=0), and transmits the first V2C message V2C1 (=00) to the first check node CN1. When the LLR value LLRV1 input to the first variable node VN1 is 0 or 1; the first variable node VN1 determines that the reliability of the LLR value LLRV1 is the weak reliability W, generates the first V2C message V2C1 (=01) including the sign bit SB (=0) and the magnitude bit MB (=1), and transmits the first V2C message V2C1 (=01) to the first check node CN1.

In the embodiments illustrated in FIG. 2, the sign bit SB is 0 when the LLR value LLRV1 input to the first variable node VN1 is 0. However, in other embodiments, the sign bit SB may be 1 when the LLR value LLRV1 input to the first variable node VN1 is 0.

Figure 4:
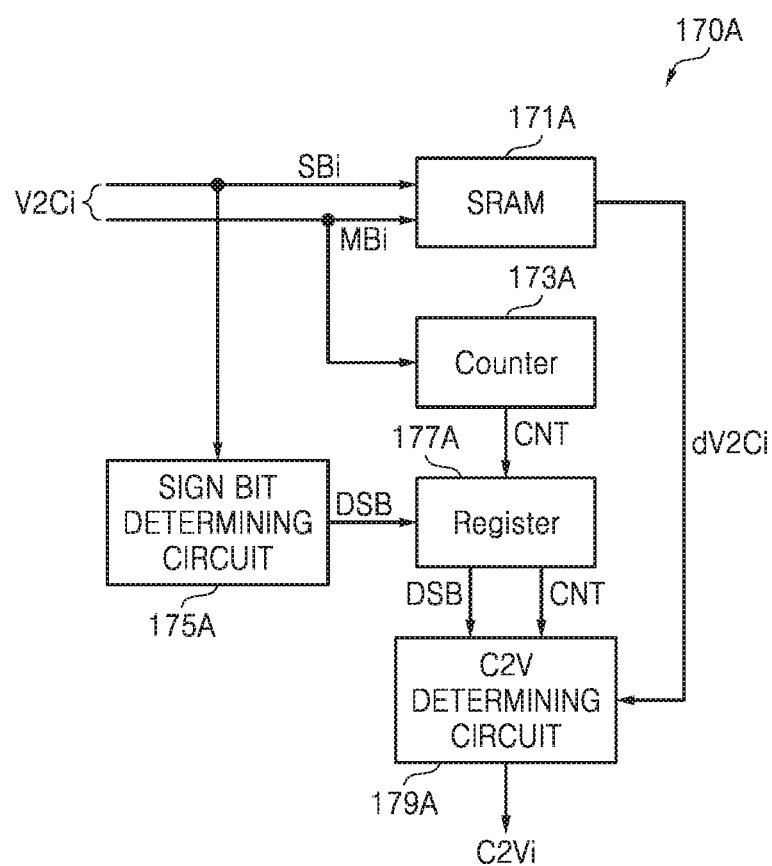
FIG. 4 is a conceptual diagram for explaining a method of determining the magnitude of a check-to-variable (C2V) message using a check node module illustrated in FIG. 1 according to some embodiments of the disclosure.

FIG. 4 is a conceptual diagram for explaining a method of determining the magnitude of a C2V message using the check node module illustrated in FIG. 1 according to some embodiments of the disclosure. The method of determining the magnitude of a C2V message using the check node module 170 or 170A will be described with reference to FIGS. 1 through 4.

It is assumed that the first LLR value LLRV1 is 2, a second LLR value LLRV2 is 2, a third LLR value LLRV3 is 0, a fourth LLR value LLRV4 is 1, and a fifth LLR value LLRV5 is 3. Accordingly, the V2C messages V2C1, V2C2, and V2C5 respectively generated by the variable nodes VN1, VN2, and VN5 have the strong reliability S; the V2C messages V2C3 and V2C4 respectively generated by the variable nodes VN3 and VN4 have the weak reliability W.

The first V2C message V2C1 is 00, the second V2C message V2C2 is 00, the third V2C message V2C3 is 01, the fourth V2C message V2C4 is 01, and the fifth V2C message V2C5 is 00. The V2C messages V2C1 through V2C5 may be sequentially transmitted to the first check node CN1. However, the V2C messages V2C1 through V2C5 may be transmitted to the first check node CN1 simultaneously or in parallel in other embodiments.

It is assumed that the check node module 170A is the first check node CN1 for convenience' sake in the description. The check node module 170A includes a first memory device 171A, a counter 173A, a sign bit determining circuit 175A, a second memory device 177A, and a C2V determining circuit 179A.

The check node module 170A or the first check node CN1 may receive the V2C messages V2C1 through V2C5 from the variable nodes VN1 through VN5, may generate a count value CNT by counting the number of messages having a specific magnitude (e.g., a magnitude bit corresponding to the weak reliability W) among the V2C messages V2C1 through V2C5, and may determine the magnitude (e.g., the magnitude bit) of a C2V message C2V1 to be transmitted to the variable node VN1 which is currently processed among the variable nodes VN1 through VN5 using the count value CNT and the magnitude (i.e., the magnitude bit) of the V2C message V2C1 of the currently-processed variable node VN1. In addition, the check node module 170A or the first check node CN1 may perform an XOR operation on the sign bit of the first V2C message V2C1 and a result of performing an XOR operation on the sign bits of the respective V2C messages V2C1 through V2C5 to determine the sign bit of the C2V message C2V1 to be transmitted to the variable node VN1.

The first memory device 171A may be formed of static RAM (SRAM) and the second memory device 177A may be formed of a register. It is assumed that the counter 173A counts the magnitude bit MB or flag indicating the weak reliability W and an initial value is 0.

Since the V2C messages V2C1 through V2C5 are sequentially transmitted to the first check node CN1, the first memory device 171A receives and stores the first V2C message V2C1 (=SB1MB1=00). The counter 173A maintains the initial value of 0. The sign bit determining circuit 175A stores a sign bit SB1 (=0) of the first V2C message V2C1 (=00).

The first memory device 171A receives and stores the second V2C message V2C2 (=SB2MB2=00). The counter 173A maintains the initial value of 0. The sign bit determining circuit 175A performs an XOR operation on the sign bit SB1 (=0) of the first V2C message V2C1 (=00) and a sign bit SB2 (=0) of the second V2C message V2C2 (=00) and stores a first XOR value.

The first memory device 171A receives and stores the third V2C message V2C3 (=SB3MB3=01). The counter 173A outputs a value of 1 as the count value CNT. The sign bit determining circuit 175A performs an XOR operation on the first XOR value and a sign bit SB3 (=0) of the third V2C message V2C3 (=01) and stores a second XOR value.

The first memory device 171A receives and stores the fourth V2C message V2C4 (=SB4MB4=01). The counter 173A outputs a value of 2 as the count value CNT. The sign bit determining circuit 175A performs an XOR operation on the second XOR value and a sign bit SB4 (=0) of the fourth V2C message V2C4 (=01) and stores a third XOR value.

The first memory device 171A receives and stores the last, i.e., the fifth V2C message V2C5 (=SB5MB5=00). The counter 173A maintains the count value CNT (=2). The sign bit determining circuit 175A performs an XOR operation on the third XOR value and a sign bit SB5 (=0) of the fifth V2C message V2C5 (=00) and stores a fourth XOR value.

The counter 173A stores the count value CNT (=2) in the second memory device 177A. The sign bit determining circuit 175A stores a final XOR value DSB, i.e., the fourth XOR value in the second memory device 177A. After the V2C messages V2C1 through V2C5 are stored in the first memory device 171A and the count value CNT (=2) and the final XOR value DSB are stored in the second memory device 177A, the first V2C message dV2C1 (=V2C1=SB1MB1=00) is transmitted to the C2V determining circuit 179A.

The C2V determining circuit 179A may determine the sign bit and magnitude (e.g., magnitude bit) of the first C2V message C2V1 to be transmitted to the first variable node VN1 using the count value CNT (=2), the final XOR value DSB, and the first V2C message V2C1 (=SB1MB1=00). In detail, the C2V determining circuit 179A may determine the sign bit of the first C2V message C2V1 by performing an XOR operation on the final XOR value DSB (=0) and the sign bit SB1 (=0) of the first V2C message dV2C1 (=V2C1=SB1MB1=00). In addition, the C2V determining circuit 179A may determine the magnitude bit of the first C2V message C2V1 using the count value CNT (=2) and the magnitude bit MB1 (=0) of the first V2C message dV2C1 (=V2C1=SB1MB1=00). The magnitude bit of the first C2V message C2V1 may be determined as 1 corresponding to the weak reliability W. A procedure for determining the magnitude bit of the C2V message will be described with reference to FIGS. 5 and 6 later.

After the sign bit and magnitude bit of the first C2V message C2V1 to be transmitted to the first variable node VN1 are determined, the check node module 170A or the first check node CN1 determines the sign bit and magnitude bit of a second C2V message to be transmitted to the second variable node VN2. A procedure for determining the sign bit and magnitude bit of the second C2V message is the same as or similar to the procedure for determining the sign bit and magnitude bit of the first C2V message C2V1. Thus, the description of the procedure will be omitted.

Next, it is assumed that the first LLR value LLRV1 is 3, a second LLR value LLRV2 is 2, a third LLR value LLRV3 is 2, a fourth LLR value LLRV4 is 3, and a fifth LLR value LLRV5 is 2. Accordingly, the V2C messages V2C1 through V2C5 respectively generated by the variable nodes VN1 through VN5 have the strong reliability S. Each of the V2C messages V2C1 through V2C5 is 00. It is assumed that the initial value of the counter 173A is 0.

Since the V2C messages V2C1 through V2C5 are sequentially transmitted to the first check node CN1, the first memory device 171A receives and stores the first V2C message V2C1 (=SB1MB1=00). The counter 173A maintains the initial value of 0. The sign bit determining circuit 175A stores the sign bit SB1 (=0) of the first V2C message V2C1 (=00).

The first memory device 171A receives and stores the second V2C message V2C2 (=SB2MB2=00). The counter 173A maintains the initial value of 0. The sign bit determining circuit 175A performs an XOR operation on the sign bit SB1 (=0) of the first V2C message V2C1 (=00) and the sign bit SB2 (=0) of the second V2C message V2C2 (=00) and stores a first XOR value.

The first memory device 171A receives and stores the third V2C message V2C3 (=SB3MB3=00). The counter 173A maintains the initial value of 0. The sign bit determining circuit 175A performs an XOR operation on the first XOR value and the sign bit SB3 (=0) of the third V2C message V2C3 (=00) and stores a second XOR value.

The first memory device 171A receives and stores the fourth V2C message V2C4 (=SB4MB4=00). The counter 173A maintains the initial value of 0. The sign bit determining circuit 175A performs an XOR operation on the second XOR value and the sign bit SB4 (=0) of the fourth V2C message V2C4 (=00) and stores a third XOR value.

The first memory device 171A receives and stores the last, i.e., the fifth V2C message V2C5 (=SB5MB5=00). The counter 173A maintains the initial value of 0. The sign bit determining circuit 175A performs an XOR operation on the third XOR value and the sign bit SB5 (=0) of the fifth V2C message V2C5 (=00) and stores a fourth XOR value.

The counter 173A stores the count value CNT (=0) in the second memory device 177A. The sign bit determining circuit 175A stores the final XOR value DSB, i.e., the fourth XOR value in the second memory device 177A. After the V2C messages V2C1 through V2C5 are stored in the first memory device 171A and the count value CNT (=0) and the final XOR value DSB are stored in the second memory device 177A, the first V2C message dV2C1 (=V2C1=SB1MB1=00) is transmitted to the C2V determining circuit 179A.

The C2V determining circuit 179A may determine the sign bit and magnitude (e.g., magnitude bit) of the first C2V message C2V1 to be transmitted to the first variable node VN1 using the count value CNT (=0), the final XOR value DSB, and the first V2C message V2C1 (=SB1MB1=00). In detail, the C2V determining circuit 179A may determine the sign bit of the first C2V message C2V1 by performing an XOR operation on the final XOR value DSB (=0) and the sign bit SB1 (=0) of the first V2C message dV2C1 (=V2C1=SB1MB1=00). In addition, the C2V determining circuit 179A may determine the magnitude bit of the first C2V message C2V1 using the count value CNT (=0) and the magnitude bit MB1 (=0) of the first V2C message dV2C1 (=V2C1=SB1MB1=00). The magnitude bit of the first C2V message C2V1 may be determined as 1 corresponding to the weak reliability S.

Next, it is assumed that the first LLR value LLRV1 is 1, a second LLR value LLRV2 is 2, a third LLR value LLRV3 is 2, a fourth LLR value LLRV4 is 3, and a fifth LLR value LLRV5 is 2. Accordingly, the first V2C message V2C1 generated by the first variable node VN1 has the weak reliability W and the V2C messages V2C2 through V2C5 respectively generated by the variable nodes VN2 through VN5 have the strong reliability S. The first V2C message V2C1 is 01 and each of the V2C messages V2C2 through V2C5 is 00. It is assumed that the initial value of the counter 173A is 0.

Since the V2C messages V2C1 through V2C5 are sequentially transmitted to the first check node CN1, the first memory device 171A receives and stores the first V2C message V2C1 (=SB1MB1=01). The counter 173A outputs 1 as the count value CNT. The sign bit determining circuit 175A stores the sign bit SB1 (=0) of the first V2C message V2C1 (=01).

The first memory device 171A receives and stores the second V2C message V2C2 (=SB2MB2=00). The counter 173A maintains the count value CNT of 1. The sign bit determining circuit 175A performs an XOR operation on the sign bit SB1 (=0) of the first V2C message V2C1 (=01) and the sign bit SB2 (=0) of the second V2C message V2C2 (=00) and stores a first XOR value.

The first memory device 171A receives and stores the third V2C message V2C3 (=SB3MB3=00). The counter 173A maintains the count value CNT of 1. The sign bit determining circuit 175A performs an XOR operation on the first XOR value and the sign bit SB3 (=0) of the third V2C message V2C3 (=00) and stores a second XOR value.

The first memory device 171A receives and stores the fourth V2C message V2C4 (=SB4MB4=00). The counter 173A maintains the count value CNT of 1. The sign bit determining circuit 175A performs an XOR operation on the second XOR value and the sign bit SB4 (=0) of the fourth V2C message V2C4 (=00) and stores a third XOR value.

The first memory device 171A receives and stores the last, i.e., the fifth V2C message V2C5 (=SB5MB5=00). The counter 173A maintains the count value CNT of 1. The sign bit determining circuit 175A performs an XOR operation on the third XOR value and the sign bit SB5 (=0) of the fifth V2C message V2C5 (=00) and stores a fourth XOR value.

The counter 173A stores the count value CNT (=1) in the second memory device 177A. The sign bit determining circuit 175A stores the final XOR value DSB, i.e., the fourth XOR value in the second memory device 177A. After the V2C messages V2C1 through V2C5 are stored in the first memory device 171A and the count value CNT (=1) and the final XOR value DSB are stored in the second memory device 177A, the first V2C message dV2C1 (=V2C1=SB1MB1=01) is transmitted to the C2V determining circuit 179A.

The C2V determining circuit 179A may determine the sign bit and magnitude (e.g., magnitude bit) of the first C2V message C2V1 to be transmitted to the first variable node VN1 using the count value CNT (=1), the final XOR value DSB, and the first V2C message V2C1 (=SB1MB1=01). In detail, the C2V determining circuit 179A may determine the sign bit of the first C2V message C2V1 by performing an XOR operation on the final XOR value DSB (=0) and the sign bit SB1 (=0) of the first V2C message dV2C1 (=V2C1=SB1MB1=01). In addition, the C2V determining circuit 179A may determine the magnitude bit of the first C2V message C2V1 using the count value CNT (=1) and the magnitude bit MB1 (=1) of the first V2C message dV2C1 (=V2C1=SB1MB1=01). The magnitude bit of the first C2V message C2V1 may be determined as 1 corresponding to the weak reliability S.

Next, it is assumed that the first LLR value LLRV1 is 1, a second LLR value LLRV2 is 2, a third LLR value LLRV3 is 0, a fourth LLR value LLRV4 is 1, and a fifth LLR value LLRV5 is 3. Accordingly, the V2C messages V2C2 and V2C5 respectively generated by the variable nodes VN2 and VN5 have the strong reliability S and the V2C messages V2C1, V2C3, and V2C4 respectively generated by the variable nodes VN1, VN3, and VN4 have the weak reliability W. The first V2C message V2C1 is 01, the second V2C message V2C2 is 00, the third V2C message V2C3 is 01, the fourth V2C message V2C4 is 01, and the fifth V2C message V2C5 is 00. It is assumed that the initial value of the counter 173A is 0.

Since the V2C messages V2C1 through V2C5 are sequentially transmitted to the first check node CN1, the first memory device 171A receives and stores the first V2C message V2C1 (=SB1MB1=01). The counter 173A outputs 1 as the count value CNT. The sign bit determining circuit 175A stores the sign bit SB1 (=0) of the first V2C message V2C1 (=01).

The first memory device 171A receives and stores the second V2C message V2C2 (=SB2MB2=00). The counter 173A maintains the count value CNT of 1. The sign bit determining circuit 175A performs an XOR operation on the sign bit SB1 (=0) of the first V2C message V2C1 (=01) and the sign bit SB2 (=0) of the second V2C message V2C2 (=00) and stores a first XOR value.

The first memory device 171A receives and stores the third V2C message V2C3 (=SB3MB3=01). The counter 173A outputs 2 as the count value CNT. The sign bit determining circuit 175A performs an XOR operation on the first XOR value and the sign bit SB3 (=0) of the third V2C message V2C3 (=01) and stores a second XOR value.

The first memory device 171A receives and stores the fourth V2C message V2C4 (=SB4MB4=01). The counter 173A outputs 3 as the count value CNT. The sign bit determining circuit 175A performs an XOR operation on the second XOR value and the sign bit SB4 (=0) of the fourth V2C message V2C4 (=01) and stores a third XOR value.

The first memory device 171A receives and stores the last, i.e., the fifth V2C message V2C5 (=SB5MB5=00). The counter 173A maintains the count value CNT of 3. The sign bit determining circuit 175A performs an XOR operation on the third XOR value and the sign bit SB5 (=0) of the fifth V2C message V2C5 (=00) and stores a fourth XOR value.

The counter 173A stores the count value CNT (=3) in the second memory device 177A. The sign bit determining circuit 175A stores the final XOR value DSB, i.e., the fourth XOR value in the second memory device 177A. After the V2C messages V2C1 through V2C5 are stored in the first memory device 171A and the count value CNT (=3) and the final XOR value DSB are stored in the second memory device 177A, the first V2C message dV2C1 (=V2C1=SB1MB1=01) is transmitted to the C2V determining circuit 179A.

The C2V determining circuit 179A may determine the sign bit and magnitude (e.g., magnitude bit) of the first C2V message C2V1 to be transmitted to the first variable node VN1 using the count value CNT (=3), the final XOR value DSB, and the first V2C message V2C1 (=SB1MB1=01). In detail, the C2V determining circuit 179A may determine the sign bit of the first C2V message C2V1 by performing an XOR operation on the final XOR value DSB (=0) and the sign bit SB1 (=0) of the first V2C message dV2C1 (=V2C1=SB1MB1=01). In addition, the C2V determining circuit 179A may determine the magnitude bit of the first C2V message C2V1 using the count value CNT (=3) and the magnitude bit MB1 (=1) of the first V2C message dV2C1 (=V2C1=SB1MB1=01). The magnitude bit of the first C2V message C2V1 may be determined as 1 corresponding to the weak reliability W.

Next, it is assumed that the first LLR value LLRV1 is 2, a second LLR value LLRV2 is 1, a third LLR value LLRV3 is 0, a fourth LLR value LLRV4 is 1, and a fifth LLR value LLRV5 is 0. Accordingly, the first V2C message V2C1 generated by the first variable node VN1 has the strong reliability S and the V2C messages V2C2 through V2C5 respectively generated by the variable nodes VN2 through VN5 have the weak reliability W. The first V2C message V2C1 is 00, the second V2C message V2C2 is 01, the third V2C message V2C3 is 01, the fourth V2C message V2C4 is 01, and the fifth V2C message V2C5 is 01. It is assumed that the initial value of the counter 173A is 0.

Since the V2C messages V2C1 through V2C5 are sequentially transmitted to the first check node CN1, the first memory device 171A receives and stores the first V2C message V2C1 (=SB1MB1=00). The counter 173A maintains the initial value of 0. The sign bit determining circuit 175A stores the sign bit SB1 (=0) of the first V2C message V2C1 (=00).

The first memory device 171A receives and stores the second V2C message V2C2 (=SB2MB2=01). The counter 173A outputs 1 as the count value CNT. The sign bit determining circuit 175A performs an XOR operation on the sign bit SB1 (=0) of the first V2C message V2C1 (=00) and the sign bit SB2 (=0) of the second V2C message V2C2 (=01) and stores a first XOR value.

The first memory device 171A receives and stores the third V2C message V2C3 (=SB3MB3=01). The counter 173A outputs 2 as the count value CNT. The sign bit determining circuit 175A performs an XOR operation on the first XOR value and the sign bit SB3 (=0) of the third V2C message V2C3 (=01) and stores a second XOR value.

The first memory device 171A receives and stores the fourth V2C message V2C4 (=SB4MB4=01). The counter 173A outputs 3 as the count value CNT 1. The sign bit determining circuit 175A performs an XOR operation on the second XOR value and the sign bit SB4 (=0) of the fourth V2C message V2C4 (=01) and stores a third XOR value.

The first memory device 171A receives and stores the last, i.e., the fifth V2C message V2C5 (=SB5MB5=01). The counter 173A outputs 4 as the count value CNT. The sign bit determining circuit 175A performs an XOR operation on the third XOR value and the sign bit SB5 (=0) of the fifth V2C message V2C5 (=01) and stores a fourth XOR value.

The counter 173A stores the count value CNT (=4) in the second memory device 177A. The sign bit determining circuit 175A stores the final XOR value DSB, i.e., the fourth XOR value in the second memory device 177A. After the V2C messages V2C1 through V2C5 are stored in the first memory device 171A and the count value CNT (=4) and the final XOR value DSB are stored in the second memory device 177A, the first V2C message dV2C1 (=V2C1=SB1MB1=00) is transmitted to the C2V determining circuit 179A.

The C2V determining circuit 179A may determine the sign bit and magnitude (e.g., magnitude bit) of the first C2V message C2V1 to be transmitted to the first variable node VN1 using the count value CNT (=4), the final XOR value DSB, and the first V2C message V2C1 (=SB1MB1=00). In detail, the C2V determining circuit 179A may determine the sign bit of the first C2V message C2V1 by performing an XOR operation on the final XOR value DSB (=0) and the sign bit SB1 (=0) of the first V2C message dV2C1 (=V2C1=SB1MB1=00). In addition, the C2V determining circuit 179A may determine the magnitude bit of the first C2V message C2V1 using the count value CNT (=4) and the magnitude bit MB1 (=0) of the first V2C message dV2C1 (=V2C1=SB1MB1=00). The magnitude bit of the first C2V message C2V1 may be determined as 1 corresponding to the weak reliability W.

Next, it is assumed that the first LLR value LLRV1 is 1, a second LLR value LLRV2 is 1, a third LLR value LLRV3 is 0, a fourth LLR value LLRV4 is 1, and a fifth LLR value LLRV5 is 0. Accordingly, the V2C messages V2C1 through V2C5 respectively generated by the variable nodes VN1 through VN5 have the weak reliability W. Each of the V2C messages V2C1 through V2C5 is 01. It is assumed that the initial value of the counter 173A is 0.

Since the V2C messages V2C1 through V2C5 are sequentially transmitted to the first check node CN1, the first memory device 171A receives and stores the first V2C message V2C1 (=SB1MB1=01). The counter 173A outputs 1 as the count value CNT. The sign bit determining circuit 175A stores the sign bit SB1 (=0) of the first V2C message V2C1 (=01).

The first memory device 171A receives and stores the second V2C message V2C2 (=SB2MB2=01). The counter 173A outputs 2 as the count value CNT. The sign bit determining circuit 175A performs an XOR operation on the sign bit SB1 (=0) of the first V2C message V2C1 (=01) and the sign bit SB2 (=0) of the second V2C message V2C2 (=01) and stores a first XOR value.

The first memory device 171A receives and stores the third V2C message V2C3 (=SB3MB3=01). The counter 173A outputs 3 as the count value CNT. The sign bit determining circuit 175A performs an XOR operation on the first XOR value and the sign bit SB3 (=0) of the third V2C message V2C3 (=01) and stores a second XOR value.

The first memory device 171A receives and stores the fourth V2C message V2C4 (=SB4MB4=01). The counter 173A outputs 4 as the count value CNT. The sign bit determining circuit 175A performs an XOR operation on the second XOR value and the sign bit SB4 (=0) of the fourth V2C message V2C4 (=01) and stores a third XOR value.

The first memory device 171A receives and stores the last, i.e., the fifth V2C message V2C5 (=SB5MB5=01). The counter 173A outputs 5 as the count value CNT. The sign bit determining circuit 175A performs an XOR operation on the third XOR value and the sign bit SB5 (=0) of the fifth V2C message V2C5 (=01) and stores a fourth XOR value.

The counter 173A stores the count value CNT (=5) in the second memory device 177A. The sign bit determining circuit 175A stores the final XOR value DSB, i.e., the fourth XOR value in the second memory device 177A. After the V2C messages V2C1 through V2C5 are stored in the first memory device 171A and the count value CNT (=5) and the final XOR value DSB are stored in the second memory device 177A, the first V2C message dV2C1 (=V2C1=SB1MB1=01) is transmitted to the C2V determining circuit 179A.

The C2V determining circuit 179A may determine the sign bit and magnitude (e.g., magnitude bit) of the first C2V message C2V1 to be transmitted to the first variable node VN1 using the count value CNT (=5), the final XOR value DSB, and the first V2C message V2C1 (=SB1MB1=01). In detail, the C2V determining circuit 179A may determine the sign bit of the first C2V message C2V1 by performing an XOR operation on the final XOR value DSB (=0) and the sign bit SB1 (=0) of the first V2C message dV2C1 (=V2C1=SB1MB1=01). In addition, the C2V determining circuit 179A may determine the magnitude bit of the first C2V message C2V1 using the count value CNT (=5) and the magnitude bit MB1 (=1) of the first V2C message dV2C1 (=V2C1=SB1MB1=01). The magnitude bit of the first C2V message C2V1 may be determined as 1 corresponding to the weak reliability W.

A method by which the C2V determining circuit 179A determines the magnitude bit of a C2V message to be transmitted to a variable node to be processed will be described with reference to FIGS. 5 and 6. FIG. 5 is a table for explaining the method of determining the magnitude of a C2V message using the check node module illustrated in FIG. 1 according to some embodiments of the disclosure. FIG. 6 shows an algorithm used to determine the magnitude of a C2V message in the check node module illustrated in FIG. 1.

As described above with reference to FIGS. 1 through 4, the magnitude of the first C2V message C2V1 may be determined to be the smallest one among the magnitudes of the V2C messages V2C1 through V2C5 of the variable nodes VN1 through VN5 except for the magnitude of the first V2C message V2C1 of the variable node VN1.

As shown in a second table TABLE2 and FIG. 6, when a count value K obtained by counting magnitude bits indicating the weak reliability W is greater than 1, the magnitude of a C2V message is determined as the weak reliability W regardless of the magnitude of a V2C message of a variable node to be processed. When the count value K is 0, the magnitude of a C2V message is determined as the strong reliability S regardless of the magnitude of a V2C message of a variable node to be processed. When the count value K is 1 and the magnitude of a V2C message of a variable node to be processed is the weak reliability W, the magnitude of a C2V message is determined as the strong reliability S. When the count value K is 1 and the magnitude of a V2C message of a variable node to be processed is the strong reliability S, the magnitude of a C2V message is determined as the weak reliability W.

A method of determining a count value to be stored or updated in a check node will be described with reference to FIGS. 7 and 8. FIG. 7 shows an algorithm used to determine a count value to be stored in a check node in a layered decoder. FIG. 8 shows an algorithm used to determine a count value to be updated in a check node in a shuffled decoder. A decoder may perform a count value-magnitude computation for each check node or for each variable node at each iteration. Architecture for performing decoding for each check node is referred to as layered decoder architecture and architecture for performing decoding for each variable node is referred to as shuffled decoder architecture. In FIGS. 7 and 8, "new" indicates a current iteration and "old" indicates a previous iteration.

In the layered decoder architecture; the count value CNT may be compared with a reference value, a first value may be stored in a check node when the count value CNT is greater than the reference value, a second value may be stored in the check node when the count value CNT is equal to the reference value, and a third value may be stored in the check node when the count value CNT is less than the reference value. The first value is greater than the second value; the second value is greater than the third value; and the first through third values have the same number of bits.

In the shuffled decoder architecture, the count value CNT to be updated in a check node may be determined using the magnitude of a V2C message of a variable node at a current iteration and the magnitude of a C2V message of the variable node at a previous iteration.

Referring to FIG. 7, when the count value CNT obtained by counting the number of magnitude bits indicating the weak reliability W with respect to V2C messages at a current iteration is greater than 1 in the layered decoder architecture, the count value CNT to be stored in a check node is determined to be 2. When the count value CNT obtained by counting the number of magnitude bits indicating the weak reliability W with respect to the V2C messages at the current iteration is 1, the count value CNT to be stored in the check node is determined to be 1. When the count value CNT obtained by counting the number of magnitude bits indicating the weak reliability W with respect to the V2C messages at the current iteration is less than 1, the count value CNT to be stored in the check node is determined to be 0.

Referring to FIG. 8, when the magnitude of a V2C message at a current iteration is the weak reliability W and the magnitude of a C2V message at a previous iteration is the strong reliability S in the shuffled decoder architecture, the count value CNT to be updated in a check node is determined to be "the count value CNT obtained by counting magnitude bits indicating the weak reliability W with respect to V2C messages at the previous iteration+1". When the magnitude of the V2C message at the current iteration is the strong reliability S and the magnitude of the C2V message at the previous iteration is the weak reliability W, the count value CNT to be updated in the check node is determined to be "the count value CNT obtained by counting magnitude bits indicating the weak reliability W with respect to the V2C messages at the previous iteration −1". When the magnitude of the V2C message at the current iteration is the weak reliability W and the magnitude of the C2V message at the previous iteration is the weak reliability W, the count value CNT to be updated in the check node is maintained at "the count value CNT obtained by counting magnitude bits indicating the weak reliability W with respect to the V2C messages at the previous iteration". When the magnitude of the V2C message at the current iteration is the strong reliability S and the magnitude of the C2V message at the previous iteration is the strong reliability S, the count value CNT to be updated in the check node is maintained at "the count value CNT obtained by counting magnitude bits indicating the weak reliability W with respect to the V2C messages at the previous iteration".

FIG. 9 shows an algorithm used to approximately determine a count value to be updated in a check node in the shuffled decoder architecture. When the number of output bits of a counter which counts magnitude bits indicating the weak reliability W is decreased, the computational complexity of a decoder can be reduced. At this time, overflow occurs. There are a saturation method and a modular method in methods of processing the overflow to minimize the loss in error correction performance.

Referring to a first case CASEI in FIG. 9, when the count value CNT obtained by counting magnitude bits indicating the weak reliability W is greater than a maximum boundary value MAX_CNT in the saturation method, the count value CNT to be updated in a check node is saturated to the maximum boundary value MAX_CNT. When the count value CNT obtained by counting magnitude bits indicating the weak reliability W is less than 0, the count value CNT to be updated in the check node is saturated to 0.

Referring to a second case CASEII in FIG. 9, when the count value CNT obtained by counting magnitude bits indicating the weak reliability W is greater than a maximum boundary value MAX_CNT in the modular method, the count value CNT to be updated in the check node goes back to 0. When the count value CNT obtained by counting magnitude bits indicating the weak reliability W is less than 0, the count value CNT to be updated in the check node goes back to the maximum boundary value MAX_CNT.

Figure 10:
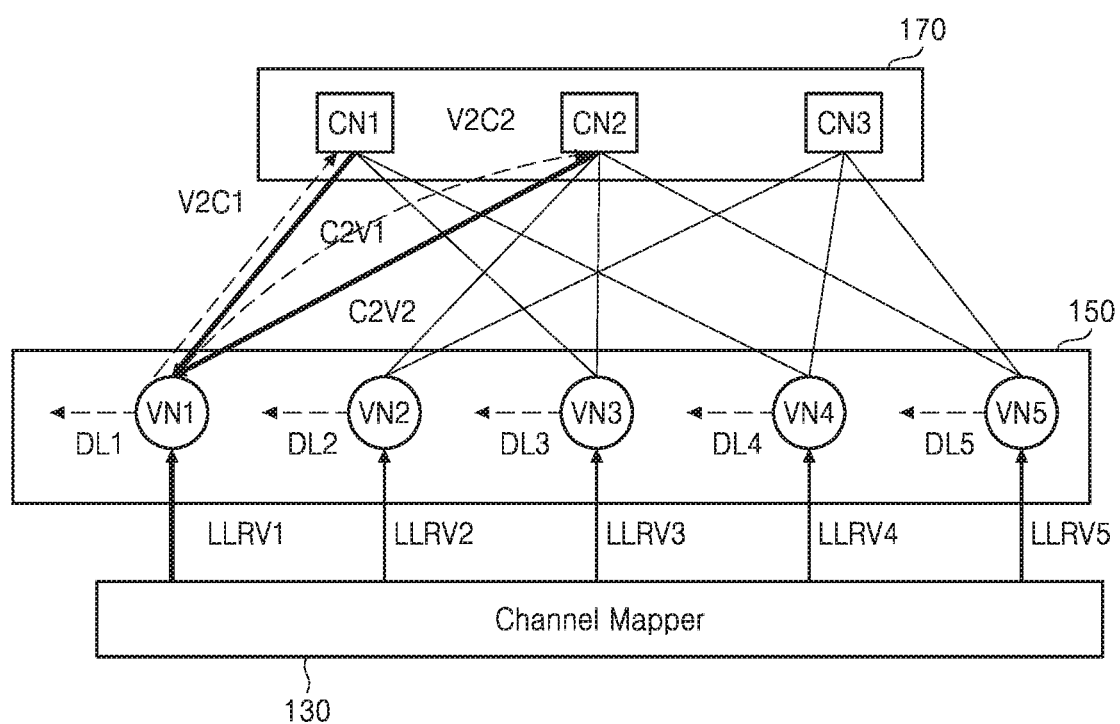
FIG. 10 is a conceptual diagram for explaining a method of determining a V2C message and a decoded log likelihood ratio (LLR) value at a subsequent iteration using the variable node module illustrated in FIG. 1.

FIG. 10 is a conceptual diagram for explaining a method of determining a V2C message and a decoded LLR value at a subsequent iteration using the variable node module illustrated in FIG. 1. It is assumed that an integer corresponding to the first C2V message C2V1 at a previous iteration is +3, an integer corresponding to a second C2V message C2V2 at the previous iteration is −1, and the first LLR value LLRV1 is −1.

Referring to FIG. 10, the first V2C message V2C1 of the variable node VN1 to be processed at a subsequent iteration may be determined using the C2V message(s) of a remaining check node(s) (for example, the second C2V message C2V2 of the check node CN2) excluding the first C2V message C2V1 of the check node CN1 to be processed and the LLR value LLRV1 input to the variable node VN1 to be processed. In detail, the sum of the integer of −1 corresponding to the second C2V message C2V2 of the remaining check node CN2 excluding the first C2V message C2V1 of the check node CN1 to be processed and the LLR value LLRV1 of −1 is −2. Accordingly, the first V2C message V2C1 at the subsequent iteration is 11 which includes the sign bit SB1 (=1) and the magnitude bit MB1 (=1).

The second V2C message V2C2 of the variable node VN1 to be processed at the subsequent iteration may be determined using the C2V message(s) of a remaining check node(s) (for example, the first C2V message C2V1 of the remaining check node CN1) excluding the second C2V message C2V2 of the check node CN2 to be processed and the LLR value LLRV1 input to the variable node VN1 to be processed. In detail, the sum of the integer of +3 corresponding to the first C2V message C2V1 of the remaining check node CN1 excluding the second C2V message C2V2 of the check node CN2 to be processed and the LLR value LLRV1 of −1 is +2. Accordingly, the second V2C message V2C2 at the subsequent iteration is 00 which includes the sign bit SB2 (=0) and the magnitude bit MB2 (=0).

A decoded LLR value DL1 of the variable node VN1 to be processed may be determined using the C2V messages C2V1 and C2V2 of the respective check nodes CN1 and CN2 and the LLR value LLRV1 input to the variable node VN1 to be processed. In detail, the sum of the integer of +3 corresponding to the first C2V message C2V1 of the first check node CN1, the integer of −1 corresponding to the second C2V message C2V2 of the check node CN2, and the LLR value LLRV1 of −1 input to the variable node VN1 to be processed is +1. Accordingly, the decoded LLR value DL1 is 01 which includes the sign bit SB1 (=0) and the magnitude bit MB1 (=1).

After the V2C messages V2C1 and V2C2 to be respectively transmitted to the check nodes CN1 and CN2 are determined in the first variable node VN1, V2C messages to be respectively transmitted to the check nodes CN2 and CN3 are determined in the second variable node VN2. A procedure for determining the V2C messages to be respectively transmitted to the check nodes CN2 and CN3 in the second variable node VN2 is the same as or similar to the procedure for determining the V2C messages V2C1 and V2C2 to be respectively transmitted to the check nodes CN1 and CN2 in the first variable node VN1. Thus, the description of the procedure will be omitted.

Figure 11:
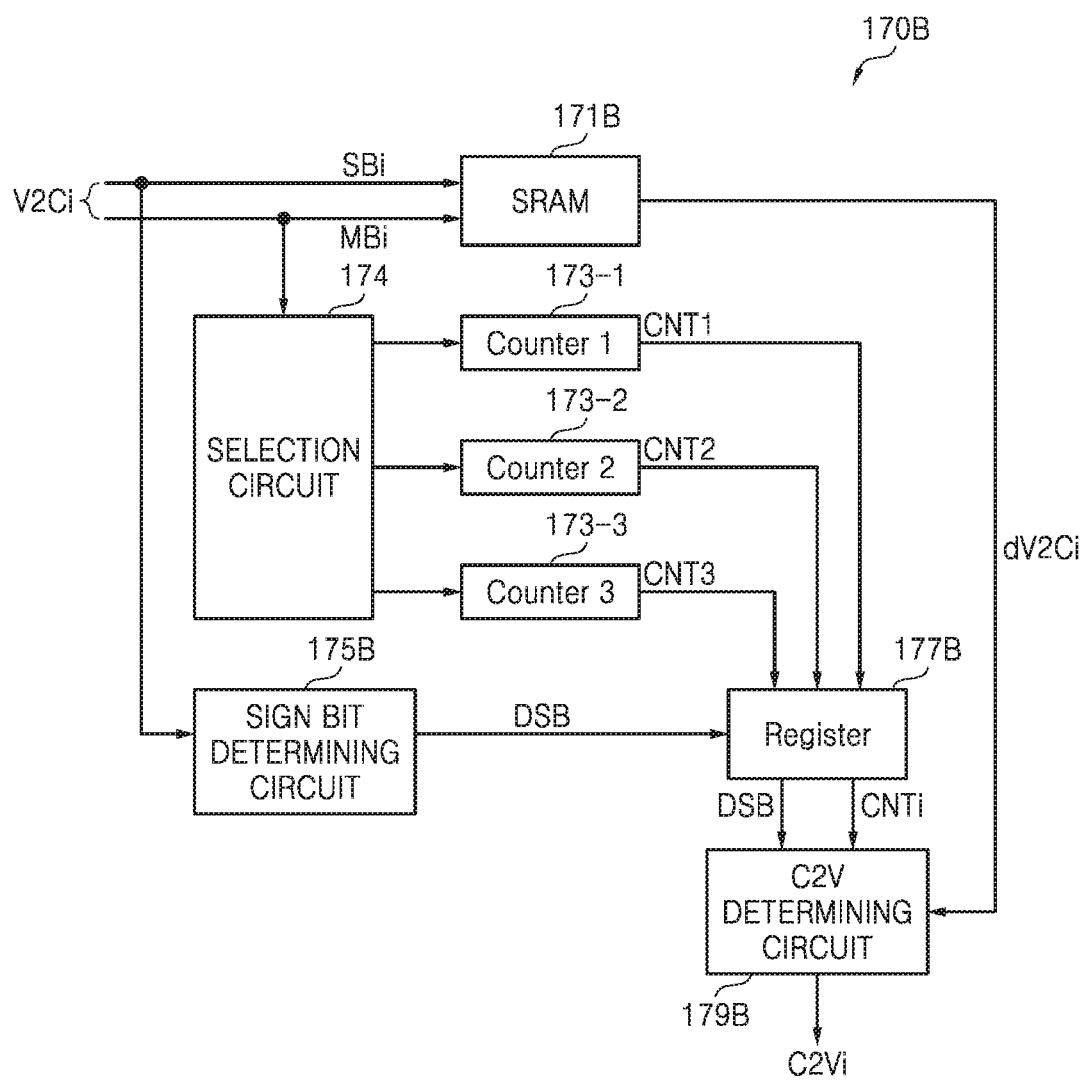
FIG. 11 is a conceptual diagram for explaining a method of determining the magnitude of a C2V message using the check node module illustrated in FIG. 1 according to other embodiments of the disclosure.

FIG. 11 is a conceptual diagram for explaining a method of determining the magnitude of a C2V message using the check node module illustrated in FIG. 1 according to other embodiments of the disclosure. FIG. 12 is a table for explaining the method of determining the magnitude of a C2V message using the check node module illustrated in FIG. 1 according to other embodiments of the disclosure. A method of operating a decoder using 3-bit precision will be described with reference to FIGS. 3, 11, and 12. In the decoder using the 3-bit precision, a sign bit is one bit in length and a magnitude bit is 2 bits in length. It is assumed that each LLR value LLRV is one of integers ranging from −3 to 3 and a specific magnitude or reliability has a value of 0, 1, 2, or 3.

It is assumed that the first LLR value LLRV1 is 2, the second LLR value LLRV2 is 0, the third LLR value LLRV3 is 0, the fourth LLR value LLRV4 is 1, and the fifth LLR value LLRV5 is 3. The reliability of each of V2C messages generated by respective variable nodes corresponds to an LLR value.

The first V2C message V2C1 is 010, the second V2C message V2C2 is 000, the third V2C message V2C3 is 000, the fourth V2C message V2C4 is 001, and the fifth V2C message V2C5 is 011. The V2C messages V2C1 through V2C5 may be sequentially transmitted to the first check node CN1. However, the V2C messages V2C1 through V2C5 may be transmitted to the first check node CN1 simultaneously or in parallel in other embodiments.

It is assumed that a check node module 170B is the first check node CN1 for convenience' sake in the description. The check node module 170B includes a first memory device 171B, counters 173-1, 173-2, and 173-3, a selection circuit 174, a sign bit determining circuit 175B, a second memory device 177B, and a C2V determining circuit 179B. When the magnitude bit of a message is "m" bits in length, the number of counters may be ($2^m$−1). Accordingly, the decoder using the 3-bit precision includes three counters.

The check node module 170B or the first check node CN1 may receive the V2C messages V2C1 through V2C5 from the variable nodes VN1 through VN5, may generate count values CNT1, CNT2, and CNT3 by counting the number of messages having one of specific magnitudes (e.g., a magnitude bit corresponding to 0, a magnitude bit corresponding to 1, and a magnitude bit corresponding to 2) among the V2C messages V2C1 through V2C5, and may determine the magnitude (e.g., the magnitude bit) of the C2V message C2V1 to be transmitted to the variable node VN1 which is currently processed among the variable nodes VN1 through VN5 using the magnitude (i.e., the magnitude bit) of the V2C message V2C1 of the variable node VN1 and the count values CNT1, CNT2, and CNT3. In addition, the check node module 170B or the first check node CN1 may perform an XOR operation on the sign bit of the first V2C message V2C1 and a result of performing an XOR operation on the sign bits of the respective V2C messages V2C1 through V2C5 to determine the sign bit of the C2V message C2V1 to be transmitted to the variable node VN1.

The first memory device 171B may be formed of SRAM and the second memory device 177B may be formed of a register. It is assumed that the first counter 173-1 counts the magnitude bit MB representing 0, the second counter 173-2 counts the magnitude bit MB representing 1, the third counter 173-3 counts the magnitude bit MB representing 2, and each of the counters 173-1 through 173-3 has an initial value of 0.

Since the V2C messages V2C1 through V2C5 are sequentially transmitted to the first check node CN1, the first memory device 171B receives and stores the first V2C message V2C1 (=SB1MB1=010). The selection circuit 174 transmits the magnitude bit MB1 (=10) of the first V2C message V2C1 to the third counter 173-3 and the third counter 173-3 outputs 1 as the count value CNT3. The sign bit determining circuit 175B stores the sign bit SB1 (=0) of the first V2C message V2C1 (=010).

The first memory device 171B receives and stores the second V2C message V2C2 (=SB2MB2=000). The selection circuit 174 transmits the magnitude bit MB2 (=00) of the second V2C message V2C2 to the first counter 173-1 and the first counter 173-1 outputs 1 as the count value CNT1. The sign bit determining circuit 175B performs an XOR operation on the sign bit SB1 (=0) of the first V2C message V2C1 (=010) and the sign bit SB2 (=0) of the second V2C message V2C2 (=000) and stores a first XOR value.

The first memory device 171B receives and stores the third V2C message V2C3 (=SB3MB3=000). The selection circuit 174 transmits the magnitude bit MB3 (=00) of the third V2C message V2C3 to the first counter 173-1 and the first counter 173-1 outputs 2 as the count value CNT1. The sign bit determining circuit 175B performs an XOR operation on the first XOR value and the sign bit SB3 (=0) of the third V2C message V2C3 (=000) and stores a second XOR value.

The first memory device 171B receives and stores the fourth V2C message V2C4 (=SB4MB4=001). The selection circuit 174 transmits the magnitude bit MB4 (=01) of the fourth V2C message V2C4 to the second counter 173-2 and the second counter 173-2 outputs 1 as the count value CNT2. The sign bit determining circuit 175B performs an XOR operation on the second XOR value and the sign bit SB4 (=0) of the fourth V2C message V2C4 (=001) and stores a third XOR value.

The first memory device 171B receives and stores the last, i.e., the fifth V2C message V2C5 (=SB5MB5=011). The sign bit determining circuit 175B performs an XOR operation on the third XOR value and the sign bit SB5 (=0) of the fifth V2C message V2C5 (=011) and stores a fourth XOR value.

The counters 173-1 through 173-3 respectively output the count values CNT1, CNT2, and CNT3 to the second memory device 177B. The second memory device 177B stores the count values CNT1, CNT2, and CNT3. The sign bit determining circuit 175B stores the final XOR value DSB, i.e., the fourth XOR value in the second memory device 177B. After the V2C messages V2C1 through V2C5 are stored in the first memory device 171B and the count values CNT1 through CNT3 and the final XOR value DSB are stored in the second memory device 177B, the first V2C message dV2C1 (=V2C1=SB1MB1=010) is transmitted to the C2V determining circuit 179B.

The C2V determining circuit 179B may determine the sign bit and magnitude (e.g., magnitude bit) of the first C2V message C2V1 to be transmitted to the first variable node VN1 using the count values CNT1 through CNT3, the final XOR value DSB, and the first V2C message V2C1 (=SB1MB1=010). In detail, the C2V determining circuit 179B may determine the sign bit of the first C2V message C2V1 by performing an XOR operation on the final XOR value DSB (=0) and the sign bit SB1 (=0) of the first V2C message dV2C1 (=V2C1=SB1MB1=010). In addition, the C2V determining circuit 179B may determine the magnitude bit of the first C2V message C2V1 using the count values CNT1 (=2), CNT2 (=1), and CNT3 (=1) and the magnitude bit MB1 (=10) of the first V2C message dV2C1 (=V2C1=SB1MB1=010). The magnitude bit of the first C2V message C2V1 may be determined as 0.

After the sign bit and magnitude bit of the first C2V message C2V1 to be transmitted to the first variable node VN1 are determined, the check node module 170B or the first check node CN1 determines the sign bit and magnitude bit of a second C2V message to be transmitted to the second variable node VN2. A procedure for determining the sign bit and magnitude bit of the second C2V message is the same as or similar to the procedure for determining the sign bit and magnitude bit of the first C2V message C2V1. Thus, the description of the procedure will be omitted.

Next, it is assumed that the first LLR value LLRV1 is 0 and each of the second through fifth LLR values LLRV2 through LLRV5 is 3. The reliability of each of V2C messages generated by respective variable nodes corresponds to an LLR value. The first V2C message V2C1 is 000 and each of the second through fifth V2C messages V2C2 through V2C5 is 011. It is assumed that each of the counters 173-1 through 173-3 has an initial value of 0.

Since the V2C messages V2C1 through V2C5 are sequentially transmitted to the first check node CN1, the first memory device 171B receives and stores the first V2C message V2C1 (=SB1MB1=000). The selection circuit 174 transmits the magnitude bit MB1 (=00) of the first V2C message V2C1 to the first counter 173-1 and the first counter 173-1 outputs 1 as the count value CNT1. The sign bit determining circuit 175B stores the sign bit SB1 (=0) of the first V2C message V2C1 (=000).

The first memory device 171B receives and stores the second V2C message V2C2 (=SB2MB2=011). The sign bit determining circuit 175B performs an XOR operation on the sign bit SB1 (=0) of the first V2C message V2C1 (=000) and the sign bit SB2 (=0) of the second V2C message V2C2 (=011) and stores a first XOR value.

The first memory device 171B receives and stores the third V2C message V2C3 (=SB3MB3=011). The sign bit determining circuit 175B performs an XOR operation on the first XOR value and the sign bit SB3 (=0) of the third V2C message V2C3 (=011) and stores a second XOR value.

The first memory device 171B receives and stores the fourth V2C message V2C4 (=SB4MB4=011). The sign bit determining circuit 175B performs an XOR operation on the second XOR value and the sign bit SB4 (=0) of the fourth V2C message V2C4 (=011) and stores a third XOR value.

The first memory device 171B receives and stores the last, i.e., the fifth V2C message V2C5 (=SB5MB5=011). The sign bit determining circuit 175B performs an XOR operation on the third XOR value and the sign bit SB5 (=0) of the fifth V2C message V2C5 (=011) and stores a fourth XOR value.

The counters 173-1 through 173-3 respectively output the count values CNT1, CNT2, and CNT3 to the second memory device 177B. The second memory device 177B stores the count values CNT1, CNT2, and CNT3. The sign bit determining circuit 175B stores the final XOR value DSB, i.e., the fourth XOR value in the second memory device 177B. After the V2C messages V2C1 through V2C5 are stored in the first memory device 171B and the count values CNT1 through CNT3 and the final XOR value DSB are stored in the second memory device 177B, the first V2C message dV2C1 (=V2C1=SB1MB1=000) is transmitted to the C2V determining circuit 179B.

The C2V determining circuit 179B may determine the sign bit and magnitude (e.g., magnitude bit) of the first C2V message C2V1 to be transmitted to the first variable node VN1 using the count values CNT1 through CNT3, the final XOR value DSB, and the first V2C message V2C1 (=SB1MB1=000). In detail, the C2V determining circuit 179B may determine the sign bit of the first C2V message C2V1 by performing an XOR operation on the final XOR value DSB (=0) and the sign bit SB1 (=0) of the first V2C message dV2C1 (=V2C1=SB1MB1=000). In addition, the C2V determining circuit 179B may determine the magnitude bit of the first C2V message C2V1 using the count values CNT1 (=1), CNT2 (=0), and CNT3 (=0) and the magnitude bit MB1 (=00) of the first V2C message dV2C1 (=V2C1=SB1MB1=000). The magnitude bit of the first C2V message C2V1 may be determined as 3.

Next, it is assumed that the first LLR value LLRV1 is 0, the second and third LLR values LLRV2 and LLRV3 are 2, and the fourth and fifth LLR values LLRV4 and LLRV5 are 3. The reliability of each of V2C messages generated by respective variable nodes corresponds to an LLR value. The first V2C message V2C1 is 000, the second and third V2C messages V2C2 and V2C3 are 010, and the fourth and fifth V2C messages V2C4 and V2C5 are 011. It is assumed that each of the counters 173-1 through 173-3 has an initial value of 0.

Since the V2C messages V2C1 through V2C5 are sequentially transmitted to the first check node CN1, the first memory device 171B receives and stores the first V2C message V2C1 (=SB1MB1=000). The selection circuit 174 transmits the magnitude bit MB1 (=00) of the first V2C message V2C1 to the first counter 173-1 and the first counter 173-1 outputs 1 as the count value CNT1. The sign bit determining circuit 175B stores the sign bit SB1 (=0) of the first V2C message V2C1 (=000).

The first memory device 171B receives and stores the second V2C message V2C2 (=SB2MB2=010). The selection circuit 174 transmits the magnitude bit MB2 (=10) of the second V2C message V2C2 to the third counter 173-3 and the third counter 173-3 outputs 1 as the count value CNT3. The sign bit determining circuit 175B performs an XOR operation on the sign bit SB1 (=0) of the first V2C message V2C1 (=000) and the sign bit SB2 (=0) of the second V2C message V2C2 (=010) and stores a first XOR value.

The first memory device 171B receives and stores the third V2C message V2C3 (=SB3MB3=010). The selection circuit 174 transmits the magnitude bit MB3 (=10) of the third V2C message V2C3 to the third counter 173-3 and the third counter 173-3 outputs 2 as the count value CNT3. The sign bit determining circuit 175B performs an XOR operation on the first XOR value and the sign bit SB3 (=0) of the third V2C message V2C3 (=010) and stores a second XOR value.

The first memory device 171B receives and stores the fourth V2C message V2C4 (=SB4MB4=011). The sign bit determining circuit 175B performs an XOR operation on the second XOR value and the sign bit SB4 (=0) of the fourth V2C message V2C4 (=011) and stores a third XOR value.

The first memory device 171B receives and stores the last, i.e., the fifth V2C message V2C5 (=SB5MB5=011). The sign bit determining circuit 175B performs an XOR operation on the third XOR value and the sign bit SB5 (=0) of the fifth V2C message V2C5 (=011) and stores a fourth XOR value.

The counters 173-1 through 173-3 respectively output the count values CNT1, CNT2, and CNT3 to the second memory device 177B. The second memory device 177B stores the count values CNT1, CNT2, and CNT3. The sign bit determining circuit 175B stores the final XOR value DSB, i.e., the fourth XOR value in the second memory device 177B. After the V2C messages V2C1 through V2C5 are stored in the first memory device 171B and the count values CNT1 through CNT3 and the final XOR value DSB are stored in the second memory device 177B, the first V2C message dV2C1 (=V2C1=SB1MB1=000) is transmitted to the C2V determining circuit 179B.

The C2V determining circuit 179B may determine the sign bit and magnitude (e.g., magnitude bit) of the first C2V message C2V1 to be transmitted to the first variable node VN1 using the count values CNT1 through CNT3, the final XOR value DSB, and the first V2C message V2C1 (=SB1MB1=000). In detail, the C2V determining circuit 179B may determine the sign bit of the first C2V message C2V1 by performing an XOR operation on the final XOR value DSB (=0) and the sign bit SB1 (=0) of the first V2C message dV2C1 (=V2C1=SB1MB1=000). In addition, the C2V determining circuit 179B may determine the magnitude bit of the first C2V message C2V1 using the count values CNT1 (=1), CNT2 (=0), and CNT3 (=2) and the magnitude bit MB1 (=00) of the first V2C message dV2C1 (=V2C1=SB1MB1=000). The magnitude bit of the first C2V message C2V1 may be determined as 2.

As described above with reference to FIGS. 1 and 11, the magnitude of the first C2V message C2V1 may be determined to be the smallest one among the magnitudes of the V2C messages V2C1 through V2C5 of the variable nodes VN1 through VN5 except for the magnitude of the first V2C message V2C1 of the variable node VN1.

As shown in a third table TABLE3, when a count value obtained by counting magnitude bits indicating 0 is greater than 2, the magnitude of a C2V message is determined as 0 regardless of a count value obtained by counting magnitude bits indicating 1, a count value obtained by counting magnitude bits indicating 2, and the magnitude of a V2C message of a variable node to be processed. When the count value obtained by counting magnitude bits indicating 0 is 1, the count value obtained by counting magnitude bits indicating 1 is 0, the count value obtained by counting magnitude bits indicating 2 is 0, and the magnitude of a V2C message of a variable node to be processed is 0; the magnitude of a C2V message of the variable node is determined as 3. When the count value obtained by counting magnitude bits indicating 0 is 1, the count value obtained by counting magnitude bits indicating 1 is 0, the count value obtained by counting magnitude bits indicating 2 is greater than 1, and the magnitude of a V2C message of a variable node to be processed is 0; the magnitude of a C2V message of the variable node is determined as 2.

Figure 13:
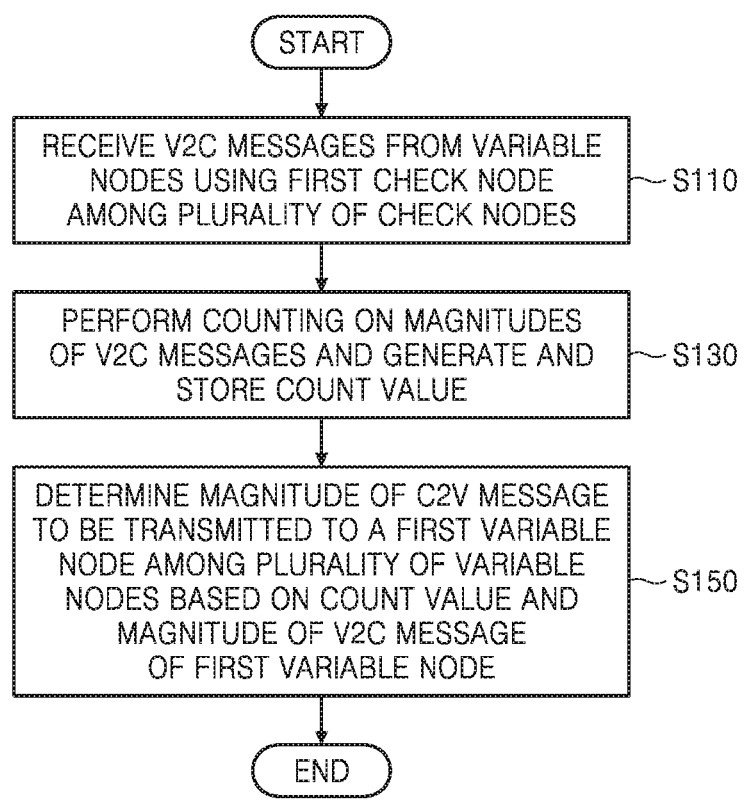
FIG. 13 is a flowchart of a method of operating the decoder illustrated in FIG. 1 according to some embodiments of the disclosure.

FIG. 13 is a flowchart of a method of operating the decoder illustrated in FIG. 1 according to some embodiments of the disclosure. Referring to FIGS. 3 and 13, the first check node CN1 among a plurality of check nodes may receive the V2C messages V2C1 through V2C5 from at least one of the variable nodes VN1 through VN5 in operation S110. The check node CN1 may generate the count value K by performing counting on the magnitudes of the respective V2C messages V2C1 through V2C5 in operation S130. The first check node CN1 may determine the magnitude of the first C2V message C2V1 to be transmitted to a variable node to be processed, e.g., the first variable node VN1 based on the count value K and the magnitude of the V2C message V2C1 of the first variable node VN1 in operation S150.

Figure 14:
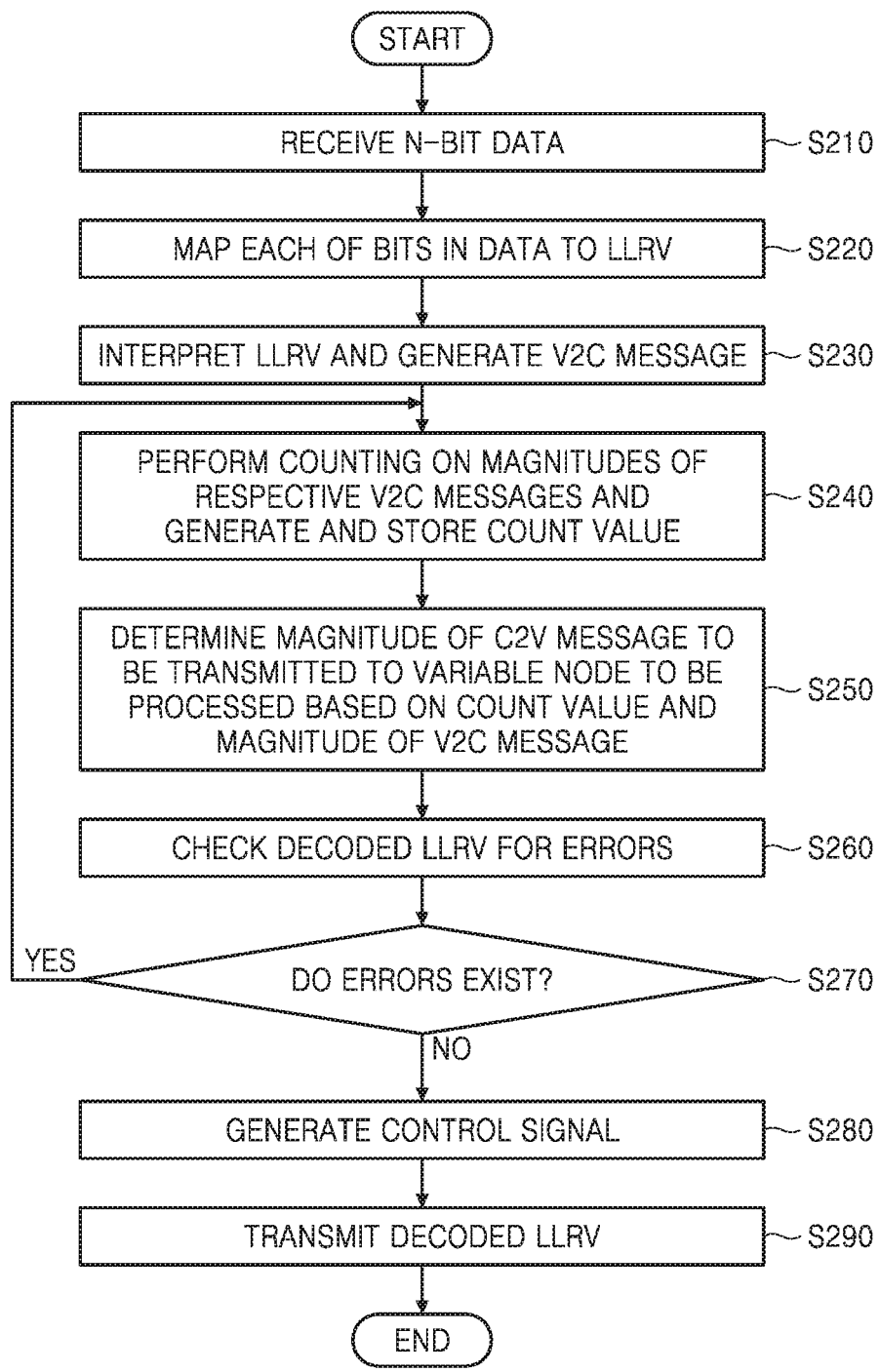
FIG. 14 is a flowchart of a method of operating a data storage device illustrated in FIG. 1 according to some embodiments of the disclosure.

FIG. 14 is a flowchart of a method of operating the data storage device 300 illustrated in FIG. 1 according to some embodiments of the disclosure. Referring to FIGS. 1, 3, and 14, the input buffer 120 may receive N-bit (where N is a natural number of at least 1) data from the memory 400 in operation S210. The channel mapper 130 may map each of bits in the data output from the input buffer 120 to an LLR value LLRV in operation S220.

Each of variable nodes included in the variable node module 150 may receive each LLR value from the channel mapper 130 and generate a V2C message corresponding to the LLR value LLRV in operation S230. Each of check nodes included in the check node module 170 may receive a V2C message from at least one of the variable nodes. Each check node may count a specific magnitude (e.g., the weak reliability W) with respect to at least one V2C message and generate the count value CNT in operation S240.

The check node may determine the magnitude of a C2V message to be transmitted to a variable node to be processed among the variable nodes based on the count value CNT and the magnitude of the V2C message of the variable node in operation S250. The check node may transmit the C2V message to the variable node and may store the count value CNT. Each of the variable nodes may output the decoded LLR value DL based on a C2V message. The error checker 180 may check on errors using the sign bits of decoded LLR values DL in operation S260.

When it is determined that errors exist in the decoded LLR values DL (i.e., in case of YES) in operation S270, the logic circuit 140 may perform an iteration in operations S240 through S270. When it is determined that no errors exist in the decoded LLR values DL (i.e., in case of NO) in operation S270, the error checker 180 may generate a control signal for disabling the variable node module 150 and the check node module 170 in operation S280 and may transmit the control signal to the variable node module 150 and the check node module 170.

When the variable node module 150 and the check node module 170 are disabled, the error checker 180 may transmit the decoded data DATA1 to the output buffer 190. The output buffer 190 may transmit the decoded data DATA1 to the host 200 in operation S290.

Figure 15:
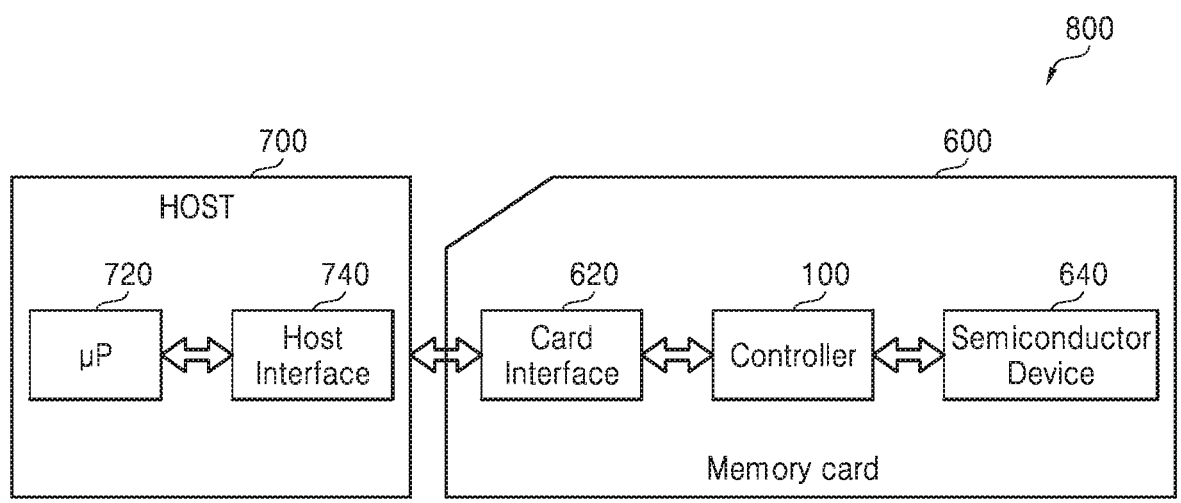
FIG. 15 is a block diagram of a data processing system including a controller illustrated in FIG. 1 according to other embodiments of the disclosure.

FIG. 15 is a block diagram of a data processing system 800 including the controller illustrated in FIG. 1 according to other embodiments of the disclosure. Referring to FIG. 15, the data processing system 800 may be implemented as a memory card or a smart card. The data processing system 800 includes a memory card 600 and a host 700. The memory card 600 includes a semiconductor device 640, the controller 100, and a card interface 620. The controller 100 may control data exchange between the semiconductor device 640 and the card interface 620. The card interface 620 may be a secure digital (SD) card interface or a multi-media card (MMC) interface, but the disclosure is not restricted to these examples.

The card interface 620 may interface a host 700 and the controller 100 for data exchange according to a protocol of the host 700. The card interface 620 may support a universal serial bus (USB) protocol and an interchip (IC)-USB protocol. Here, the card interface 620 may refer to hardware supporting a protocol used by the host 700, software installed in the hardware, or a signal transmission mode.

When the memory card 600 is connected with the host 700 such as a PC, a tablet PC, a digital camera, a digital audio player, a cellular phone, a console video game hardware, or a digital set-top box, a host interface 740 of the host 700 may perform data communication with the semiconductor device 640 through the card interface 620 and the controller 100 according to the control of a microprocessor 720.

As described above, according to some embodiments of the disclosure, each check node counts V2C messages having a specific reliability and stores a count value, so that a bit precision relevant to the magnitude of each V2C message is reduced. In addition, the computational complexity of a decoder is minimized without the error correction performance of the decoder being affected. Also, the throughput of the decoder is increased while the power consumption of the decoder is reduced. Moreover, since the number of output bits of a counter, which counts the number of V2C messages having the specific reliability among V2C messages input to the check node, is reduced, the computational complexity of the decoder is also reduced.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to exemplary embodiments thereof, it will be understood by those of ordinary skill in the art that various changes in forms and details may be made therein without departing from the spirit and scope of the disclosure as defined by the following claims.

What is claimed is:

1. A decoder comprising:
a variable node module configured to receive at least one check-to-variable message corresponding to at least one variable node, output a plurality of variable-to-check messages, and output decoded data corresponding to the at least one variable node; and
a check node module configured to receive the plurality of variable-to-check messages and generate at least one updated check-to-variable message corresponding to at least one check node based on a count of a number of multiple messages having a specific magnitude among the plurality of variable-to-check messages, wherein
the check node module decreases the count when one of the plurality of variable-to-check messages indicates a strong reliability and at least one previous check-to-variable message corresponding to the one of the plurality of variable-to-check messages indicates a weak reliability.

2. The decoder of claim 1, wherein each of the at least one check-to-variable message includes a two-bit message.

3. The decoder of claim 1, wherein each of the plurality of variable-to-check messages includes a two-bit message.

4. The decoder of claim 1, wherein the check node module generates the count.

5. The decoder of claim 1, wherein the check node module generates a count of a number of messages having each of distinct magnitudes among the plurality of variable-to-check messages.

6. The decoder of claim 1, wherein:
each of the plurality of variable-to-check messages includes a sign bit, and
the check node module generates at least one updated sign bit for the at least one updated check-to-variable message based on sign bits of the plurality of variable-to-check messages.

7. The decoder of claim 6, wherein the check node module performs a first exclusive OR operation on the sign bits and performs a second exclusive OR operation on a result of the first exclusive OR operation and a sign bit of a selected one of the plurality of variable-to-check messages to generate the sign bit for the at least one updated check-to-variable message, the at least one updated check-to-variable message corresponding to the selected one.

8. The decoder of claim 1, wherein:
each of the plurality of variable-to-check messages includes a magnitude bit, and
the check node module generates the count by counting a number of magnitude bits indicating a weak reliability.

9. The decoder of claim 8, wherein when the count is greater than a threshold value, the check node module generates at least one updated magnitude bit indicating a weak reliability for the at least one updated check-to-variable message.

10. The decoder of claim 8, wherein when the count is zero, the check node module generates at least one updated magnitude bit indicating a strong reliability for the at least one updated check-to-variable message.

11. The decoder of claim 8, wherein when the count is greater than zero and less than a threshold value and when the magnitude bit of a selected one of the plurality of variable-to-check messages indicates a weak reliability, the check node module generates at least one updated magnitude bit indicating a strong reliability for the at least one updated check-to-variable message, the at least one updated check-to-variable message corresponding to the selected one.

12. The decoder of claim 8, wherein when the count is greater than zero and less than a threshold value and when the magnitude bit of a selected one of the plurality of variable-to-check messages indicates a strong reliability, the check node module generates at least one updated magnitude bit indicating a weak reliability for the at least one updated check-to-variable message, the at least one updated check-to-variable message corresponding to the selected one.

13. The decoder of claim 1, wherein the check node module increases the count when the plurality of variable-to-check messages indicates a weak reliability and at least one previous variable-to-check message corresponding to the plurality of variable-to-check messages indicates a strong reliability.

14. The decoder of claim 1, wherein the check node module maintains the count when the plurality of variable-to-check messages indicates and at least one previous variable-to-check message corresponding to the plurality of variable-to-check messages indicates a same reliability.

15. An apparatus comprising:
producing means for producing a plurality of variable-to-check messages corresponding to at least one variable node;
outputting means for outputting decoded data corresponding to the at least one variable node;
receiving means for receiving check-to-variable messages corresponding to the at least one variable node;
count generating means for generating a count of a number of multiple messages having a specific magnitude among the plurality of variable-to-check messages; and
update generating means for generating at least one updated check-to-variable message corresponding to at least one check node, the update generating means responsive to the plurality of variable-to-check messages and configured to generate the at least one updated check-to-variable message based on the count, wherein
the count generating means decreases the count when one of the plurality of variable-to-check messages indicates a strong reliability and at least one previous check-to-variable message corresponding to the one of the plurality of variable-to-check messages indicates a weak reliability.

16. A method comprising:
outputting a plurality of variable-to-check messages corresponding to at least one check node;
outputting decoded data corresponding to at least one variable node;
receiving check-to-variable messages corresponding to the variable node;
generating a count of a number of multiple messages having a specific magnitude among the plurality of variable-to-check messages;
decreasing the count when one of the plurality of variable-to-check messages indicates a strong reliability and at least one previous check-to-variable message corresponding to the one of the plurality of variable-to-check messages indicates a weak reliability;
outputting the count; and
generating at least one updated check-to-variable message based on the count in response to the plurality of variable-to-check messages.

17. The method of claim 16, wherein:
each of the at least one updated check-to-variable message includes a two-bit message, and
each of the plurality of variable-to-check messages includes a two-bit message.

18. The method of claim 16, wherein the check node generates the count.

19. The method of claim 16, further comprising generating a count of a number of messages having each of distinct magnitudes among the plurality of variable-to-check messages.

* * * * *